United States Patent [19]
Kim

[11] Patent Number: 5,911,857
[45] Date of Patent: Jun. 15, 1999

[54] METHOD FOR FORMING METAL WIRING OF SEMICONDUCTOR DEVICES

[75] Inventor: Heon Do Kim, Kyoungki-do, Rep. of Korea

[73] Assignee: Hyundai Electronics Industries Co., Ltd., Kyoungki-do, Rep. of Korea

[21] Appl. No.: 08/859,361

[22] Filed: May 20, 1997

[30] Foreign Application Priority Data

Jun. 27, 1996 [KR] Rep. of Korea ............... 96-24249

[51] Int. Cl.[6] .................. C23C 14/34; H01L 21/203
[52] U.S. Cl. ............... 204/192.15; 204/192.17; 204/192.25; 438/622; 438/648; 438/656
[58] Field of Search ............... 204/192.12, 192.17, 204/192.15, 192.25, 298.07, 298.12, 298.13, 192.22; 438/622, 648, 656; 257/751, 758, 763, 764; 427/255.1

[56] References Cited

U.S. PATENT DOCUMENTS

| | | | |
|---|---|---|---|
| 5,192,589 | 3/1993 | Sandhu | 427/255.1 |
| 5,202,579 | 4/1993 | Fujii et al. | 257/751 |
| 5,290,731 | 3/1994 | Sugano et al. | 437/174 |
| 5,306,952 | 4/1994 | Matsuura et al. | 257/763 |
| 5,397,744 | 3/1995 | Sumi et al. | 437/200 |
| 5,654,235 | 8/1997 | Matsumoto et al. | 438/648 |
| 5,665,210 | 9/1997 | Yamakazi | 204/192.15 |
| 5,723,362 | 3/1998 | Inoue et al. | 204/192.15 |
| 5,780,356 | 7/1998 | Kim | 438/648 |

FOREIGN PATENT DOCUMENTS

| | | | |
|---|---|---|---|
| 1-206596 | 8/1989 | Japan . | |
| 92-034478/05 | 7/1990 | Japan | 204/192.22 |
| 278218 | 6/1996 | Taiwan . | |

*Primary Examiner*—Nam Nguyen
*Assistant Examiner*—Gregg Cantelmo
*Attorney, Agent, or Firm*—Nath & Associates; Gary M. Nath; Harold L. Novick

[57] ABSTRACT

A method for forming a metal wiring of a semiconductor device, which is capable of requiring no additional thermal process, so that the number of processing steps is reduced, thereby reducing the manufacturing costs and improving the productivity of the semiconductor device. The method includes the steps of providing a semiconductor substrate, forming an interlayer insulating film provided with a contact hole on the semiconductor substrate, forming a first titanium film over the resulting structure obtained after the formation of the interlayer insulating film, forming a multilayer, which consists of a first titanium nitride film, a titanium oxide film and a second nitride film, over the first titanium film, forming a second titanium film over the second titanium nitride film, and forming a metal wiring on the second titanium film.

20 Claims, 1 Drawing Sheet

METHOD FOR FORMING METAL WIRING OF SEMICONDUCTOR DEVICES

BACKGROUND OF THE INVENTION

1. Field of the Invention

The present invention relates to a method for forming the metal wiring of a semiconductor device, and more particularly to a method for forming the metal wiring of a highly integrated semiconductor device.

2. Description of the Prior Art

Generally, semiconductor devices have a wiring adapted to electrically connect associated elements to each other or to an external circuit. Such a wiring is formed by burying a wiring material in contact holes and via holes to form a wiring layer, and subsequently processing the wiring layer.

Where a low resistance is required, a metal wiring is typically used.

Such a metal wiring is made of an aluminum-based material containing a small amount of silicon or copper, or an aluminum alloy containing silicon and copper and exhibiting low specific resistance and superior workability. For the formation of such a metal wiring, a method wherein a wiring material is deposited in accordance with a sputtering method using a physical vapor deposition (PVD) process to bury contact holes and via holes has been widely used.

The recent high integration trend of semiconductor devices inevitably involves a reduction in the size of metal contacts along with an increase in topology. As a result, the step coverage of an anti-diffusion metal layer formed using a sputtering process becomes poor. This results in a degradation of the reliability of metal wirings. Such an anti-diffusion metal layer typically has a multilayer structure consisting of a Ti film and a TiN film. Since such Ti and TiN films have a columnar structure, they are formed using an $O_2$ stuffing process.

In connection with this, a conventional method for forming a metal wiring of a semiconductor device will be described in conjunction with FIG. 1.

FIG. 1 is a sectional view illustrating the conventional metal wiring forming method.

In accordance with this method, a planarizing film 3 is first formed over a conductive layer 1 which may be a semiconductor substrate, as shown in FIG. 1.

Thereafter, the planarizing film 3 is selectively removed in accordance with an etch process using a metal wiring contact mask (not shown), thereby forming a contact hole 5. The semiconductor substrate 1 is partially exposed at a desired portion thereof through the contact hole 5.

A titanium film 7 and a titanium nitride film 9 are then sequentially formed over the resulting structure. The titanium nitride film 9 is then subjected to an $O_2$ stuffing process. Thus, an anti-diffusion film is obtained which has a multilayer structure consisting of the titanium film 7 and titanium nitride film 9.

However, the conventional method has various problems. Specifically, the conventional method involves a degradation in the step coverage for semiconductor devices of an ultra-high integration. As a result, it is difficult to control the diffusion of $O_2$ in the TiN thin film. This results in a degraded contact resistance caused by an over diffusion of $O_2$ or a leakage of current caused by an insufficient diffusion of $O_2$.

In order to solve such problems caused by the poor step coverage, the conventional method requires the use of a collimator process and a wide gap process. However, such processes reduce the productivity of semiconductor devices.

SUMMARY OF THE INVENTION

An objective of the invention is to solve the above-mentioned problems involved in the prior art and to provide a method for forming the metal wiring of a semiconductor device, which does not require an additional thermal process, so that the number of processing steps is reduced, thereby reducing the manufacturing costs and improving the productivity of the semiconductor device.

Another objective of the invention is to provide a method for forming metal wiring of a semiconductor device, which is capable of improving the reliability of a semiconductor device, thereby enabling the high integration of a semiconductor device.

In accordance with one aspect of the present invention, a method for forming a metal wiring of a semiconductor device is provided and comprises the steps of: providing a semiconductor substrate; forming an interlayer insulating film provided with a contact hole on the semiconductor substrate; forming a first titanium film over the resulting structure obtained after the formation of the interlayer insulating film; forming a multilayer, which consists of a first titanium nitride film, a titanium oxide film and a second nitride film, over the first titanium film; forming a second titanium film over the second titanium nitride film; and forming a metal wiring on the second titanium film.

In accordance with another aspect of the present invention, a method for forming a metal wiring of a semiconductor device is provided and comprises the steps of: preparing a semiconductor substrate; forming an interlayer insulating film provided with a contact hole on the semiconductor substrate; forming a first titanium film over the resulting structure obtained after the formation of the interlayer insulating film; forming a multilayer, which consists of a titanium nitride film and a titanium oxide film, over the first titanium film; forming a second titanium film over the titanium oxide film; and forming a metal wiring on the second titanium film.

BRIEF DESCRIPTION OF THE DRAWINGS

Other objectives and aspects of the invention will become apparent from the following description of embodiments with reference to the accompanying drawings in which.

DETAILED DESCRIPTION OF THE PREFERRED EMBODIMENTS

Figure 1:
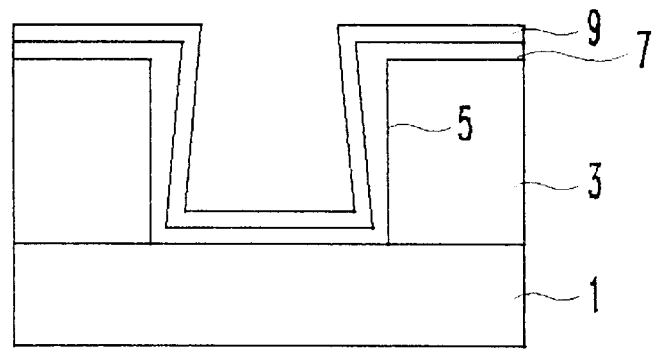
FIG. 1 is a sectional view illustrating a conventional method for forming the metal wiring of a semiconductor device.
Figure 2:
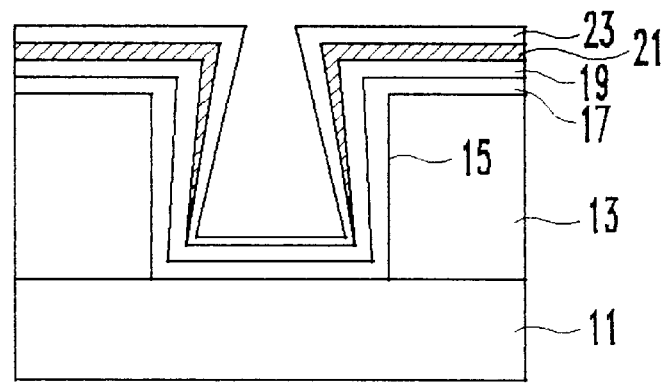
FIGS. 2 and 3 are sectional views respectively illustrating a method for forming the metal wiring of a semiconductor device in accordance with the present invention.
Figure 3:
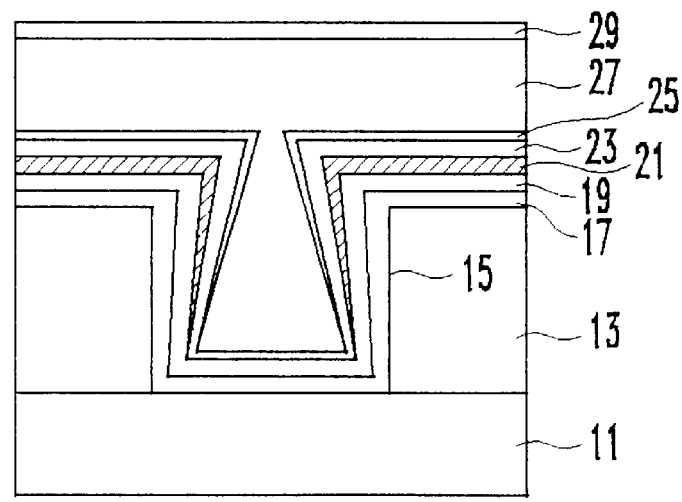

FIGS. 2 and 3 illustrate a method for forming the metal wiring of a semiconductor device in accordance with the present invention.

In accordance with the method of the present invention, a planarizing film 13 is first formed over a semiconductor substrate 11, as shown in FIG. 2.

Thereafter, the planarizing film 13 is etched in accordance with an etch process using a metal wiring contact mask (not shown), thereby forming a contact hole 15. The semiconductor substrate 11 is partially exposed at a desired portion thereof through the contact hole 15.

A titanium film 17 is then deposited to a desired thickness over the resulting structure in accordance with a collimator process. In place of the titanium film 17, a layer made of a heat-resistant metal having a high melting point may be formed. For example, the heat-resistant metal may be W or Ta.

A multilayer, which includes a first titanium nitride film 19, a titanium oxide film 21 and a second titanium nitride film 23, is formed over the titanium film 17 in a cluster device using a collimator without generating a vacuum break. The multilayer may be made of a heat-resistant metal having a high melting point such as W or Ta, in place of titanium.

The deposition of the multilayer consisting of the first titanium nitride film 19 and titanium oxide film 21 and second titanium nitride film 23 is carried out in a single sputtering chamber.

The deposition of the first titanium nitride film 19 is carried out in accordance with a reactive sputtering process using a mixture of Ar and $N_2$. The deposition of the titanium oxide film 21 is carried out in accordance with the reactive sputtering process while using a mixture of Ar and $O_2$. On the other hand, the second titanium nitride film 23 is carried out in accordance with a reactive sputtering process using a mixture of Ar and $N_2$.

The deposition of the titanium oxide film 21 is performed under the condition that the partial pressure of $O_2$ corresponds to the pressure at which the target is oxidized into $TiO_x$. The partial pressure of $O_2$ is affected by the sputtering device, the supply voltage and the temperature in the deposition process.

The deposition of the titanium oxide film 21 may be carried out under the condition that the supply voltage ranges from about 4 KW to about 20 KW, and the partial pressure of $O_2$ corresponds to 70% of the total pressure of the gas mixture.

Since the titanium oxide film 21 contains a sufficient amount of $O_2$, it is unnecessary to subsequently perform an additional thermal process for the stuffing of $O_2$.

The titanium nitride films 19 and 23 are changed into titanium oxide nitride films (not shown) in accordance with a subsequent thermal process. Thus, a reliable anti-diffusion film is obtained.

Thereafter, a second titanium film 25, an aluminum alloy film 27 and an anti-reflection film 29 are sequentially formed over the second titanium nitride film 23 in a clustered sputtering device, as shown in FIG. 3.

The deposition of the aluminum alloy film 27 is carried out in such a manner that it completely fills the contact hole 15 in accordance with a double-step deposition process or a high temperature aluminum alloying process such as a reflow process.

Although not shown, the films 25, 27 and 29 are then selectively removed in accordance with an etch process using a metal wiring mask. Thus, a metal wiring is obtained.

In accordance with another embodiment of the present invention, the anti-diffusion film may have a multilayer structure consisting of a first titanium film, a titanium nitride film, a titanium oxide film and a second titanium film. In this case, the same processes as those of FIGS. 2 and 3 are used.

As is apparent from the above description, the metal wiring forming method according to the present invention provides various effects.

That is, in accordance with the present invention, it is possible to accurately and reproducible control the amount of $O_2$ diffused in the anti-diffusion film at the contact hole region. Accordingly, a reliable anti-diffusion film is obtained.

The method of the present invention requires no additional thermal process because $O_2$ is supplied by the titanium oxide film in the sputtering process. Accordingly, it is possible to reduce the number of processing steps.

This results in a reduction in manufacturing costs and an improvement in the productivity of semiconductor devices.

Therefore, an improvement in the reliability of semiconductor devices is obtained, thereby achieving the high integration of semiconductor devices.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method for forming a metal wiring of a semiconductor device, comprising the steps of:

providing a semiconductor substrate;

forming an interlayer insulating film provided with a contact hole on the semiconductor substrate;

forming a first high-melting point metal film over the resulting structure obtained after the formation of the interlayer insulating film;

forming a multilayer, which consists of a first high-melting point metal nitride film, a high-melting point metal oxide film and a second high-melting point metal nitride film, over the first high-melting point metal film;

forming a second high-melting point metal film over the second high-melting point metal nitride film; and forming a metal wiring on the second high-melting point metal film.

2. The method in accordance with claim 1, wherein the high-melting point metal is titanium.

3. The method in accordance with claim 2, wherein the first titanium nitride film, titanium oxide film and second titanium nitride film of the multilayer are formed in a single sputtering chamber.

4. The method in accordance with claim 2, wherein the first titanium nitride film is formed in accordance with a reactive sputtering process using a gas mixture of Ar and $N_2$.

5. The method in accordance with claim 2, wherein the titanium oxide film is formed in accordance with a reactive sputtering process using a gas mixture of Ar and $O_2$.

6. The method in accordance with claim 5, wherein the formation of the titanium oxide film is carried out using a supply voltage of 4 to 20 KW under the condition in which the partial pressure of $O_2$ is 70% or less of the total pressure of the gas mixture.

7. The method in accordance with claim 2, wherein the second titanium nitride film is formed in accordance with a sputtering process using a gas mixture of Ar and $N_2$.

8. The method in accordance with claim 2, wherein the first titanium film, first titanium nitride film, titanium oxide film, second titanium nitride film and second titanium film are used as an anti-diffusion film.

9. The method in accordance with claim 1, wherein the step of forming the metal wiring comprises the step of sequentially forming an aluminum alloy layer and an anti-reflection layer over the second high-melting point metal film.

10. The method in accordance with claim 1, wherein the high-melting point metal is selected from the group consisting of Ta, W and titanium.

11. A method for forming a metal wiring of a semiconductor device, comprising the steps of:
  providing a semiconductor substrate;
  forming an interlayer insulating film provided with a contact hole on the semiconductor substrate;
  forming a first high-melting point metal film over the resulting structure obtained after the formation of the interlayer insulating film;
  forming a multilayer, which consists of a high-melting point metal nitride film and a high-melting point metal oxide film, over the first high-melting point metal film;
  forming a second high-melting point metal film over the high-melting point metal oxide film; and
  forming a metal wiring on the second high-melting point metal film.

12. The method in accordance with claim 11, wherein the high-melting point metal is titanium.

13. The method in accordance with claim 12, wherein the titanium nitride film and titanium oxide film of the multilayer are formed in a single sputtering chamber.

14. The method in accordance with claim 12, wherein the titanium nitride film is formed in accordance with a reactive sputtering process using a gas mixture of Ar and $N_2$.

15. The method in accordance with claim 12, wherein the titanium oxide film is formed in accordance with a reactive sputtering process using a gas mixture of Ar and $O_2$.

16. The method in accordance with claim 15, wherein the formation of the titanium oxide film is carried out using a supply voltage of 4 to 20 KW under the condition in which the partial pressure of $O_2$ is 70% or less of the total pressure of the gas mixture.

17. The method in accordance with claim 12, wherein the first titanium film, titanium nitride film, titanium oxide film and second titanium film are used as an anti-diffusion film.

18. The method in accordance with claim 11, wherein the step of forming the metal wiring comprises the step of sequentially forming an aluminum alloy layer and an anti-reflection layer over the second high-melting point metal film.

19. The method in accordance with claim 11, wherein the high-melting point metal is selected from the group consisting of Ta, W and titanium.

20. A method for forming a metal wiring of a semiconductor device, comprising the steps of:
  providing a semiconductor substrate;
  forming an interlayer insulating film provided with a contact hole on the semiconductor substrate;
  forming a first titanium film over the resulting structure obtained after the formation of the interlayer insulating film;
  forming a multilayer, which consists of a first titanium nitride film, a titanium oxide film and a second nitride film, over the first titanium film;
  forming a second titanium film over the second titanium nitride film; and
  forming a metal wiring on the second titanium film.

* * * * *